United States Patent [19]

Tamm et al.

[11] Patent Number: 5,666,722
[45] Date of Patent: Sep. 16, 1997

[54] METHOD OF MANUFACTURING PRINTED CIRCUIT BOARDS

[75] Inventors: Wilhelm Tamm, Aidlingen; Walter Olbrich, Magstadt; Siegfrid Dippon, Gechingen; Michael Weitmann, Holzgerlingen, all of Germany; Si-Ty Lam, Pleasanton, Calif.

[73] Assignee: Hewlett-Packard Company, Palo Alto, Calif.

[21] Appl. No.: 403,445

[22] Filed: Mar. 15, 1995

[30] Foreign Application Priority Data

Apr. 14, 1994 [EP] European Pat. Off. ............. 94105764

[51] Int. Cl.$^6$ ............. H05K 3/02; H05K 3/10; H05K 3/42
[52] U.S. Cl. ............. 29/847; 29/833; 29/852; 427/97
[58] Field of Search ............. 29/721, 833, 847, 29/852; 156/154, 272.8; 219/121.61, 121.62; 427/97, 99

[56] References Cited

U.S. PATENT DOCUMENTS

| | | | |
|---|---|---|---|
| 4,651,417 | 3/1987 | Schumacher, III et al. | 29/847 X |
| 4,943,346 | 7/1990 | Mattelin | 427/97 X |
| 5,245,751 | 9/1993 | Locke et al. | 29/852 |
| 5,361,491 | 11/1994 | Oomachi et al. | 29/852 |

FOREIGN PATENT DOCUMENTS

| | | |
|---|---|---|
| 0 164 564 A1 | 12/1985 | European Pat. Off. . |
| 0 287 843 A1 | 10/1988 | European Pat. Off. . |
| 0 469 635 A1 | 2/1992 | European Pat. Off. . |
| 2 394 228 | 1/1979 | France . |
| 1066052 | 1/1984 | U.S.S.R. ............. 29/833 |

OTHER PUBLICATIONS

Research Disclosure No. 340, Aug. 1992, Emsworth, GB, "Circuit Fabrication Process".
Research Disclosure No. 312, Apr. 312, Apr. 1990, Emsworth, GB, "Laser Preparation of Epoxy Glass Composites for Electrolytic Metal Deposition".
Research Disclosure No. 326, Jun. 1991, Emsworth, GB, "PWB made by Laser Ablation of a Plastic Covered Substrate".
R. Baumann et al., "Local Electrical Conductivity in Poly-(Bis–Alkylthio–Acetylene) Layers after Laser Irradiation," *Synthetic Metals*, 55–57, 1993, pp. 3643–3648.

*Primary Examiner*—Peter Vo

[57] ABSTRACT

A printed circuit board is made by producing recesses and/or holes in an electric insulating substrate by laser ablation. The recesses correspond to a desired pattern of conductor structures and/or holes. Conductive material is then deposited on substantially an entire face of the substrate. Conductive material is then removed from the substrate outside the desired pattern of conductor structures and/or holes.

14 Claims, 4 Drawing Sheets

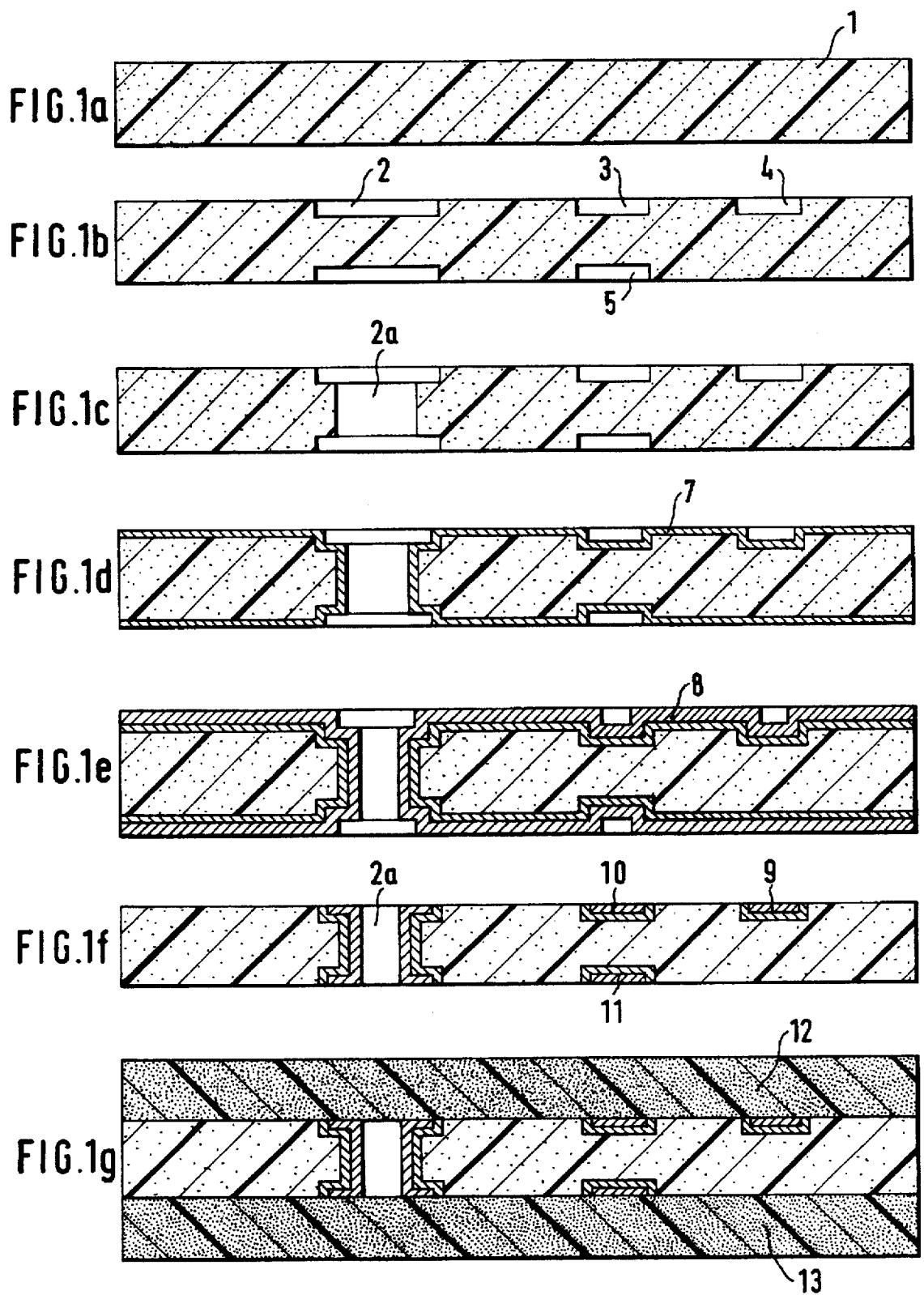

METHOD OF MANUFACTURING PRINTED CIRCUIT BOARDS

The invention relates to a method of manufacturing printed circuit boards wherein metallic conductor structures according to a desired pattern and holes are produced in an electric insulating substrate and more particularly to such a method using laser ablation.

BACKGROUND OF THE INVENTION

One known method of manufacturing printed circuit boards uses photolithographic techniques to produce desired patterns of conductor structures on an electric insulating substrate, i.e. carrier board. In such photolithographic processes, photosensitive material (photoresist) is exposed to light according to the desired pattern of conductor structures; the photoresistive material is then developed so that metal underneath layers are only accessible in certain areas. Further steps comprise etching the underneath layers, removing the remaining photoresist and possibly depositing additional metal layers either by electroplating or by electroless (chemical) metal deposition. Cleaning and activating steps may also be included. Such known methods are commonly classified into subtractive and additive methods. To produce through-holes or blind holes, mechanical drilling with subsequent copper deposition is used.

More recently, lasers have also been used in the manufacture of printed circuit boards. EP-A-0 164 564, for example, discloses the use of an excimer laser to produce blind holes in a substrate; the process of removing material from a substrate is called laser ablation. EP-A-0 287 843 discloses the removal of nucleation on a carrier board, for example a palladium compound, by a UV laser. The removal of an etch resist layer by a Nd-YAG laser is disclosed in EP-O 469 635. From Research Disclosure RD 32646, published June, 1991, a process for making a printed circuit board is known which starts from a laminate comprising a central layer containing catalyst particles which can activate an electroless plating process and a second layer which does not contain catalyst particles. The second layer is removed in certain areas and holes are created by laser ablation, and finally electroless plating is carried out to metallize the pattern and the walls of the holes.

SUMMARY OF THE INVENTION

In view of the prior art, it is an object of the invention to provide a new and improved method of manufacturing printed circuit board which does not require photolithographic process steps and which does not require catalyst particles in an isolating carrier material.

It is a further object of the invention to provide a new and improved method of producing printed circuits on a carrier substrate so the conductor structures have a very high density, resulting in conductor structures having sizes in the range of and below one micrometer.

An additional object of the invention is to provide a new and improved method of manufacturing printed circuits to produce conductor structures in a single flexible carrier substrate without requiring multiple laminated substrate layers.

According to one aspect of the present invention, these objects are achieved by a process comprising the steps of a) producing recesses and/or holes in an electric insulating substrate by laser ablation, said recesses corresponding to a desired pattern of conductor structures and/or holes, b) then depositing conductive material on substantially an entire face of the substrate, and c) then removing conductive material from the substrate outside the desired pattern of conductor structures and/or holes.

Compared to known manufacturing processes, the invention requires only a small number of process steps. Consequently, the usual problem of registration of the conductor structures which is particularly pronounced if many process steps have to be performed (e.g., multiple cycles of exposure, drilling etc.) is no longer present. Furthermore, the manufacturing process of the invention is fast, cost effective, and ensures high reproducability and quality. Another advantage is that the process starts with a simple and inexpensive base material, such as a dielectric foil or substrate, whereas prior art processes require multilayer laminated materials which are expensive and often not available in uniform quality. According to a further advantage, the resulting surface of the printed circuit is substantially planar to allow easy lamination with other printed circuits and further processing in the manufacture of multilayer printed circuits. The method of the invention is environmentally beneficial because it does not require wet chemistry like solvents or etchants; since it is an additive process, there are no waste products. The method of the invention allows the production of small conductor structures and a high integration density.

In an embodiment of the invention, the first step involves producing recesses in a dielectric foil or substrate according to a desired pattern of conductor structures by laser ablation using a mask. In a second step, the desired holes are created by laser ablation also by using a mask. These holes can later be used for through-hole contacting or as functional openings. As an alternative, it is possible to combine these two steps in one step, by using a phase mask. The processed substrate is cleaned by a plasma process or by cleaning in an ultrasonic bath. Then, at least one entire face of the foil is metallized, for example by physical vapor deposition (PVD). The PVD layer is increased in thickness by electrochemical metal deposition or by electroplating until the final thickness of the conductor structures is achieved. Alternatively, the entire thickness of the conductor structures can be produced solely by a PVD or a similar metallization process. The foil is then processed by a grinding step to remove excess metal such that only the metallized areas in the recesses and holes, corresponding to the desired pattern, remain. Now, additional layers of dielectric material with conductor structures produced in the described way can be laminated to the processed foil, to produce multilayer circuits.

According to an alternative embodiment of the laser ablation process of the invention, the electric insulating carrier substrate (e.g., dielectric foil) comprises a material which becomes conductive when irradiated with optical energy, e.g. light waves. In that way, it is possible to deposit conductive material only in the recesses and holes which have before been produced by laser ablation. Thus, the step of removing excess material outside the areas of desired conductor structures is not necessary. A further advantage is that there are no waste products.

Instead of the mentioned optical mask for performing laser ablation, an adaptive optical system having many adjustable mirrors directing individual rays of the laser beam to the dielectric foil, can be used. Such an adaptive optical system has the advantage of being very flexible because the pattern of conductor structures and holes can quickly be changed, simply by reprogramming control of the adjustable mirrors. Furthermore, an adaptive optical system ensures a more efficient use of the energy provided by the laser to provide increased throughput in the manufacturing process.

The above and still further objects, features and advantages of the present invention will become apparent upon consideration of the following detailed description of specific embodiments thereof, especially when taken in conjunction with the accompanying drawings.

BRIEF DESCRIPTION OF THE DRAWINGS

FIGS. 1a–1g are diagrammatic illustrations of process steps of a first embodiment of the method of the invention.

DETAILED DESCRIPTION OF THE PREFERRED EMBODIMENTS

Figure 2A:
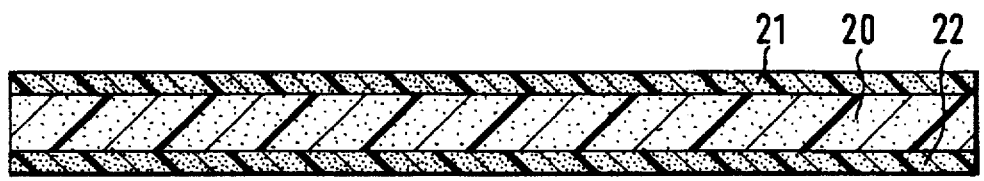
FIGS. 2a–2f are diagrammatic illustrations of process steps of a second embodiment of the invention.
Figure 2B:
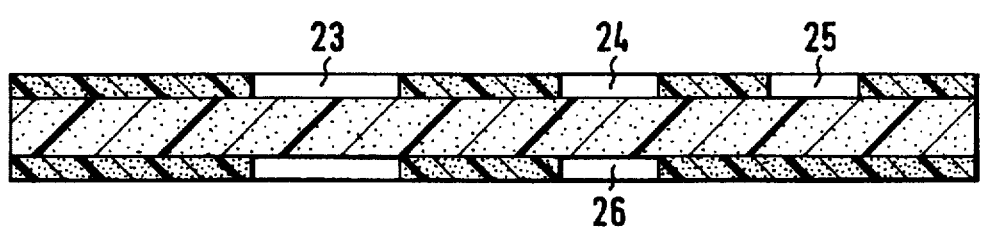
Figure 2C:

FIGS. 1a–1g are diagrammatic illustrations of steps of a first embodiment of the method of the invention. According to FIG. 1a, the starting material is an electric insulating foil, i.e. substrate, 1 made of a dielectric material, for example polyimide. The thickness of the foil 1 typically ranges from about 10 to about 80 micrometers. In a first process step, illustrated in FIG. 1b, recesses 2,3,4,5 are produced in the foil 1 by laser ablation using a pulsed or continuous excimer laser beam which is transmitted through a corresponding mask to be incident on an upper face of foil 1. The recesses 3,4,5 correspond to the desired positions of conductor structures to be formed on the printed circuit board; the recess 2 is produced at a location where a through-hole 2a will be produced in the subsequent step (FIG. 1c).

The depth of the recesses 3,4,5 is controlled by controlling the total amount of laser energy incident on the foil 1. This energy can be adjusted, for example, by appropriate control of the number of laser pulses impinging on the foil or by controlling the total time during which the foil is irradiated with the continuous laser beam. The recesses 2,3,4,5 typically have a depth of about 1 to 20 micrometers. In order to ensure that the laser beam impinges on the foil 1 only at the locations where conductor structures and holes are to be produced, a mask having transparent portions corresponding to the desired pattern of conductor structures 3 and 4 and hole 2a is superposed on the upper face of foil 1; a similar mask is superposed on the foil lower face for recess 5. Thus, a pattern of lines is created in the foil I corresponding to the desired pattern of conductor structures.

In the next step, illustrated in FIG. 1c, a desired through-hole 1a is produced in foil 1 by laser ablation. For this purpose, the foil 1 is irradiated again with an excimer laser at the locations where holes are to be created through a mask having portions transparent to the laser beam only at the locations corresponding to the holes. Typical diameters of through-hole 2a range from about 20 to about 50 micrometers.

Then, foil 1 is cleaned to remove any residues from the laser ablation process, either by using an oxygen plasma or an aqueous medium.

In the next step according to FIG. 1d, the entire areas of upper and lower faces of foil 1 and recesses 3,4,5 are metallized, as are the inner walls of the through-holes 2a.

This metallization step is performed by a physical vapor deposition (PVD) process, such as sputtering or anodic or cathodic arc evaporation. As a result of the PVD process, an approximately 200 nm thick metal layer 7 is deposited on the surface of the foil 1. Typically, the metal layer 7 comprises copper; other metals, however, such as silver, can be used. To improve adhesion of the PVD layer 7 to foil 1, an adhesive layer, such as nickel, chromium, palladium, or silver may be deposited before deposition of the PVD layer on the dielectric substrate 1, or applied in the PVD process. Alternatively, the dielectric substrate 1 can be activated in a plasma before the metal deposition step of FIG. 1d.

Thereafter, an additional metal layer 8 (preferably copper) is deposited on the PVD layer 7 either by chemical metal deposition or by a galvanic process (electroplating). According to a practical example, the thickness of the resulting layer 8 (shown in FIG. 1e) ranges from about 10 to 40 micrometers. Preferably, the thickness of the layer 8 equals the depth of the recesses 2,3,4,5.

In the next step, metal (e.g. copper) is removed from those areas on the foil 1 where no conductor structures are desired in the final printed circuit. This removal of metal outside the desired conductor structures is performed by a mechanical processing step, such as grinding, polishing, or milling. The resulting structure is shown in FIG. 1f. Thus, metal is left only where conductor structures are desired, as shown by conducting regions 9, 10 and 11 in recesses 3, 4 and 5, and in through-hole 2a. Thereafter, insulating foil 1 is electrochemically polished or briefly chemically etched to compensate for surface irregularities and to ensure a sufficiently safe process.

Then, electric insulating dielectric foils or layers 12 and 13 are respectively laminated to the top and bottom faces of the thus produced two-layer printed circuit. The result is shown in FIG. 1g. At those locations of the printed circuit which have to be electrically accessible, for example for mounting components, openings are produced in one or both of dielectric foils 12 and 13. For producing such openings, a laser ablation process is performed using an appropriate mask so that the laser beam impinges only on those spots of foils 12 and 13 where openings are to be made.

To produce multi-layer printed circuits, dielectric foils 12 and 13 are laminated to both faces of the printed circuit formed on substrate 1 after the mechanical removal (grinding) of excess metal as indicated by the step of FIG. 1f, and the process as described above is repeated. It is possible to create blind holes which provide access to layers underneath as well as through-holes.

In the process described above, through-holes 2a and recesses 3,4,5 are created in two steps, as shown in FIGS. 1b and 1c. As an alternative thereto, one could perform the ablation in a single step. According to this embodiment, a change-over mask is used, and the foil 1 is processed by laser ablation at the locations of the recesses 3,4,5 and at the locations of the holes 2a until the recesses have the required depth. Then the mask is changed and only the holes 2a are further ablated until the desired passage through the foil i has been created.

Figure 2D:
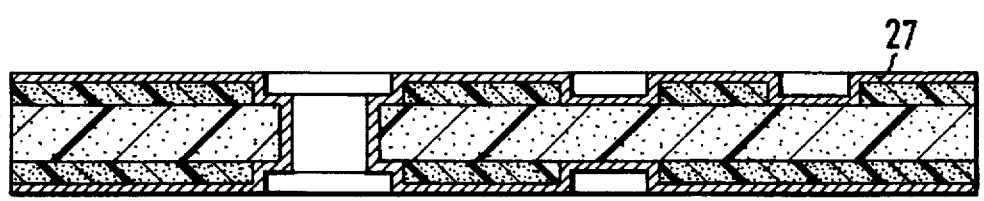

In the following, an alternative embodiment to the one described in connection with FIGS. 1a–1g is described with reference to FIGS. 2a–2f. The process starts with an electric insulating dielectric foil 20 to which electric insulating dielectric foils 21 and 22 of a different material from that of the foil 20 are laminated on both faces of foil 20, as illustrated in FIG. 1a. In the first step illustrated in FIG. 2b, the desired pattern of conductor structures 24, 25, 26 as well as recesses 23 at the locations where through-holes are desired, are produced in the foils 21 and 22 by laser ablation. In the next step, illustrated in FIG. 2c, the through-holes 23a are produced by laser ablation. Foils 21 and 22 are formed of a material that can be ablated more easily than the material of the foil 20, e.g. foils 21 and 22 are made of an insulator having a considerably lower vaporization temperature than the insulator of substrate or foil 20. In that way, the depths of the recesses 24, 25, 26 can be precisely controlled. The depths of the recesses 24, 25, 26 are equal to the thicknesses of foils 21 and 22. Then the entire upper and lower exposed faces of the composite structure are metallized by physical vapor deposition to form metal layers 27 as shown in FIG. 2d.

Figure 2E:
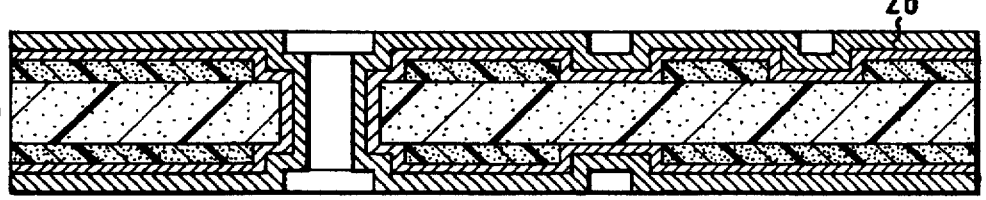
Figure 2F:
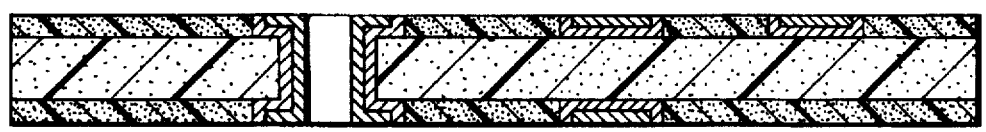

Thereafter, additional metal layers 28 are deposited by electroplating on the vapor deposited layers 27, as shown in FIG. 2e. Then, according to FIG. 2f, the upper and lower faces of the metallized foil structure shown in FIG. 2e are mechanically processed by grinding, polishing or milling, so that the metal (copper) only remains at the desired locations in recesses 24, 25, 26 and in the hole 23a. In the present embodiment, the laser ablation is performed with the same equipment as in the first embodiment, i.e., using a mask with a corresponding pattern of desired conductor structures and holes. The present embodiment of the invention has the advantage that the ablation process can be used with lasers which cannot be controlled as precisely as an excimer laser for producing the required depths in the dielectric material of foil or substrate 20. The reason is that the depth is mainly determined by the thickness of layers 21 and 22 and because layers 21 and 22 are more easily ablated than substrate 20.

A third embodiment of the method of the invention is now described with reference to FIGS. 3a–3d. According to FIG. 3a, the process starts with an electric insulating dielectric foil 30 having different electric insulating dielectric foils 31 and 32 laminated on the top and bottom faces of foil or substrate 30. A special feature of this embodiment is that substrate 30 comprises a substance which, when irradiated by a laser beam, changes from an electric insulator to an electrical conductor. Examples of such materials having laser-induced electrical conductivity are the organic polymers poly (bis ethylthio-acetylene) and poly)bis alkylthio acetylene). Materials of the mentioned type are described in: R. Baumann et al.: "Local Electrical Conductivity in Poly (Bis-Alkylthio-Acetylene) Layers After Laser Irradiation", Synthetic Metals (1993), Pages 3643–3648. The dielectric foils 31 and 32 do not have the laser-induced electrical conductivity characteristics of foil 30.

Figure 3A:
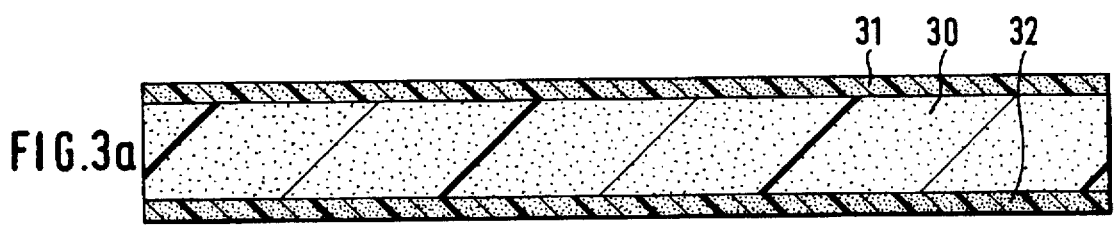
FIGS. 3a–3d are diagrammatic illustrations of process steps of a third embodiment of the invention.
Figure 3B:
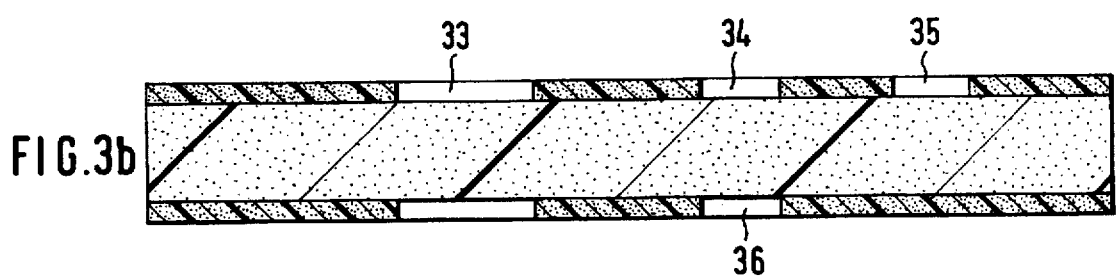
Figure 3C:
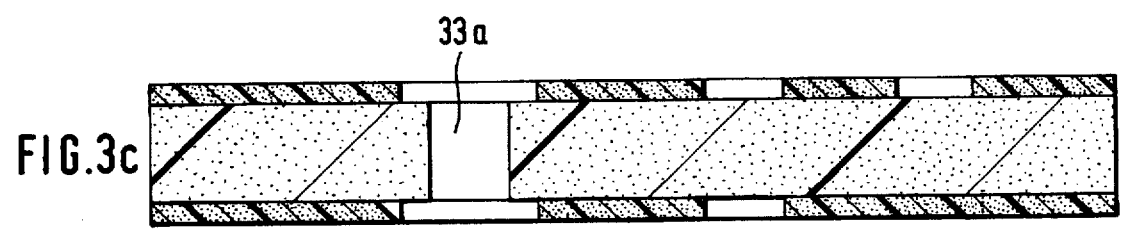
Figure 3D:
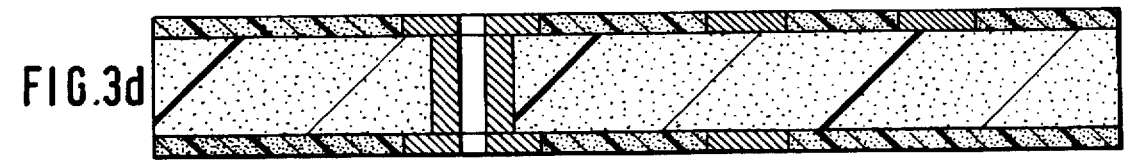

In a first step, illustrated in FIG. 3b, recesses 34, 35, 36 are formed by laser ablation in foils 31 and 32 where conductor structures are to be located; simultaneously recesses 33 are formed in laminated foils 31 and 32 by laser ablation at the location where a through-hole is desired. When the laser beam has ablated the portions of foils 31 and 32 where structures 34, 35 and 36 and recess 33 are to be located and becomes incident on substrate 30, the portion of the substrate so irradiated becomes electrically conductive. In the next step, according to FIG. 3c, through-hole 33a is produced by laser ablation. Then recesses 34, 35, 36 are filled with metal (e.g. copper) by electroless plating to produce the structure shown in FIG. 3d. One of the advantages of this embodiment is that removal of excess material is not required. The metal is only deposited at the locations 34, 35, 36 which have been irradiated by the laser. Furthermore, no waste products are produced, making the method environmentally beneficial. As an alternative to the electroless plating, the copper can also be applied by electroplating, provided all structures, such as structures 34, 35, 36, are connected via an electric contact line for plating.

It is to be understood that all the above described processes can also be used for producing multi-layer printed circuit boards by merely repeating the described process steps.

In an embodiment of the invention, the mask used for laser ablation to form the desired recesses in the dielectric substrate may be, for example, a phase mask. Such a phase mask comprises a quartz substrate on which dielectric layers are applied. The dielectric layers are completely removed from those locations of the mask corresponding to through holes in the substrate. Only some of the dielectric layers are removed from those locations of the mask corresponding to recesses in the substrate. Such a phase mask has the advantage of enabling holes and recesses for conductor structures to be created in a single process step. As an alternative thereto, the laser ablation can be performed without a mask, either by directly "writing" the laser beam on the substrate or by using an adaptive optical system. Direct writing on the substrate is accomplished either by deflecting a laser beam using, for example, a system of mirrors or refractive elements, or by moving the substrate relative to a stationary beam.

Figure 4:
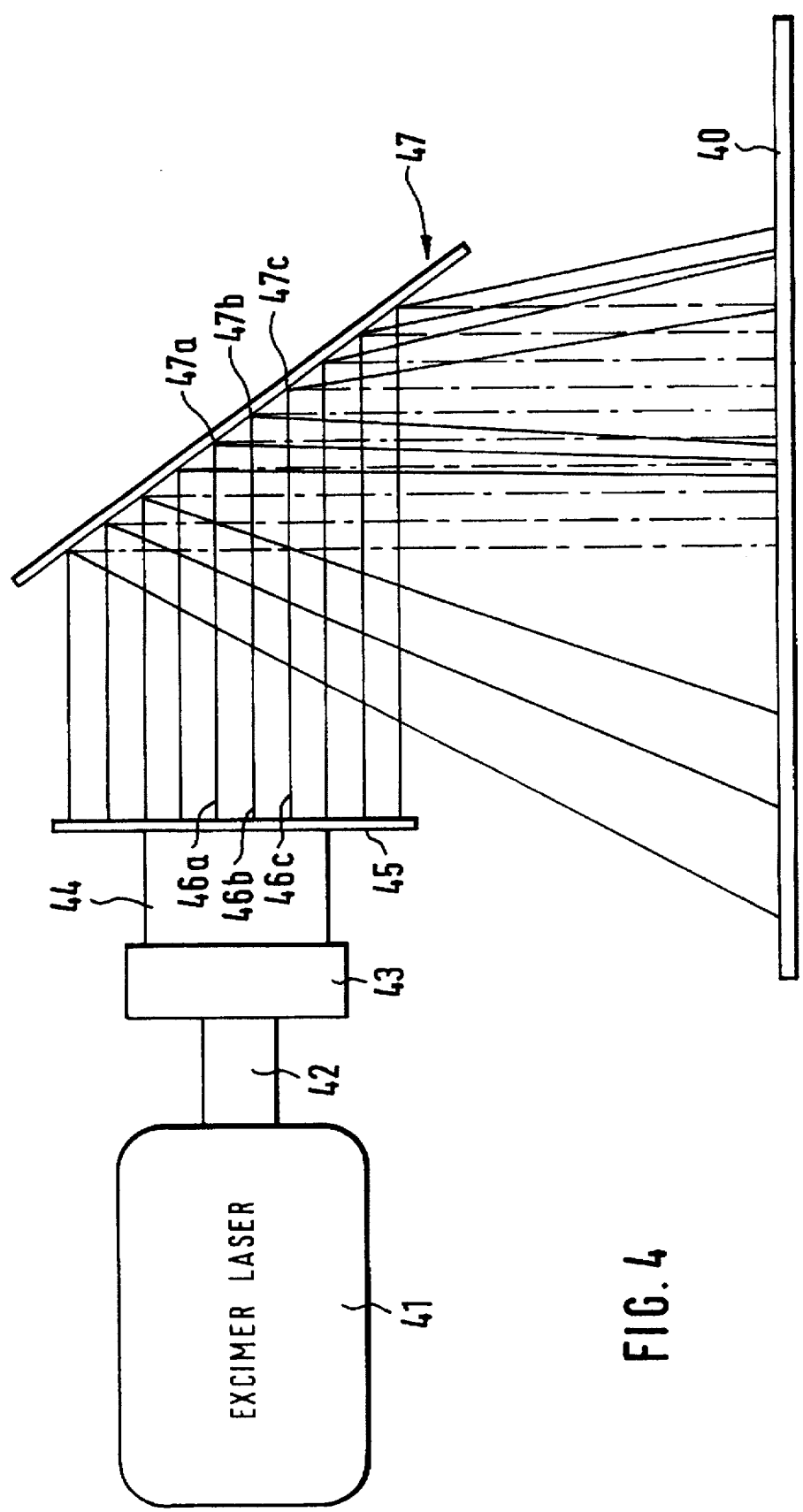
FIG. 4 is a schematic drawing of an optical system used in an embodiment of the invention.

The mentioned adaptive optical system is now described with reference to FIG. 4 wherein substrate 40 is to be processed by laser ablation. Laser beam 42 emitted by excimer laser 41 is transformed by homogenizer 43 into a wide, spatially homogeneous beam 44 that is incident on a two-dimensional array 45 of microlenses. The microlens array 45 is manufactured from a single plate and comprises several thousand individual lenses (typically about ten thousand). According to a practical example, each of the lenses of array 42 has an outer diameter of about 100 micrometers. The microlens array 45 produces from the incident beam 44 a plurality of individual beams, such as beams 46a, 46b, 46c. Beams 46a, 46b, 46c are respectively incident on corresponding mirror elements 47a, 47b, 47c of adaptive reflector 47. Each of the mirror elements of adaptive reflector 47 is individually adjusted by a separate piezoelectric drive. By corresponding control of the mirror elements of reflector 47, the beams from microlens array 45 are directed to the desired locations on the substrate 40. Thus the desired pattern of recesses and holes in the substrate is created by laser ablation. By appropriate control of the energy density of the laser beam radiation, holes and conductor structures can be produced simultaneously. The mirror elements of the adaptive reflector 47 can be moved by their associated piezoelectric drives during the laser irradiation in order to produce the desired pattern of conductor structures. A galvanometer drive could be used as an alternative to the mentioned piezoelectric drive of the mirror elements.

It is understood that the adaptive optical system described in connection with FIG. 4 can be used as an optical system for laser ablation with any of the previously described embodiments of the process of the invention.

The material of the dielectric substrate is, for example, polyimide, but other materials can also be used, such as epoxy resin, cyanate ester, polyester, polyphenylsulfide, polytetrafluorethylene, bismaleimidtriaizine. The substrate can be processed in the form of individual cut sheets or from a reel on which the plastic material is wound. Even though the dielectric substrate in a preferred embodiment of the invention is a thin foil, the invention is not limited thereto, but other forms of dielectric material can also be used, for example a dielectric carrier board.

While there have been described and illustrated several specific embodiments of the invention, it will be clear that variations in the details of the embodiments specifically illustrated and described may be made without departing from the true spirit and scope of the invention as defined in the appended claims.

We claim:

1. A method of manufacturing a printed circuit board having a desired pattern of conductor structures extending on at least one surface, comprising the following steps:
   a) providing an electric insulating substrate having a predetermined thickness defined by opposed surfaces;
   a1) producing recesses in said electric insulating substrate by laser ablation on at least one of said opposed surfaces, said recesses reaching to a controlled depth which is smaller than the thickness of said insulating substrate, and said recesses forming a pattern on the surface of said insulating substrate corresponding to said desired pattern of conductor structures,
   b) then depositing conductive material on substantially an entire face of the substrate having said recesses formed therein, and
   c) then removing conductive material from the surface of the substrate outside the desired pattern of conductor structures.

2. The method of claim 1, wherein the laser ablation comprises irradiating the substrate with an excimer laser beam for a time sufficient to produce recesses having a predetermined depth.

3. The method of claim 1 wherein the conductive material is deposited on the substrate in step b by physical vapor deposition.

4. The method of claim 1 wherein after step b) and before step c) the following step b2) is performed:
   b2) depositing conductive material on the metal layer produced during step b).

5. The method of claim 4, wherein step b2) is performed by electroplating.

6. The method of claim i wherein the step of removing conductive material from the substrate of step c is performed by grinding the face of the substrate.

7. The method of claim 1 wherein the carrier substrate is a dielectric foil.

8. The method of claim 1, wherein the carrier substrate comprises at least two dielectric foils of different materials laminated to each other and wherein the recesses are produced substantially only in one of the two foils.

9. The method of claim 8 wherein a first of the foils is laser ablated prior to a second of the foils, the first foil being made of a material that is more easily laser ablated than the material of the second foil.

10. The method of claim 1 wherein step b) is performed by sputtering.

11. The method of claim 1 wherein step a1) comprises transmitting a laser beam through a mask having openings corresponding to the desired pattern of conductor structures.

12. The method of claim 1 wherein step a1) comprises transmitting a laser beam to the substrate via an adaptive optical system having a plurality of adjustable reflecting elements that direct individual rays of the laser beam to the substrate.

13. The method of claim 1, wherein after step a1) the following step a2) is performed:
   a2) producing through-holes in selected recesses by laser ablation.

14. A method of manufacturing a printed circuit board, comprising the following steps:
   a) providing a carrier substrate of electric insulating material which becomes conductive when irradiated by optical energy,
   a1) producing recesses in said carrier substrate by laser ablation, said recesses corresponding to a desired pattern of conductor structures,
   b) directing the laser beam which caused the ablation on the material so that a portion of the substrate which is irradiated by the laser beam is changed from an electric insulator to an electric conductor, and
   c) depositing electrically conductive material only in the recesses produced during step a1).

* * * * *